(12) United States Patent
Goeoetz et al.

(10) Patent No.: US 9,105,863 B2
(45) Date of Patent: Aug. 11, 2015

(54) ORGANIC LIGHT EMITTING DIODE, METHOD FOR PRODUCING AN ORGANIC LIGHT EMITTING DIODE AND MODULE COMPRISING AT LEAST TWO ORGANIC LIGHT EMITTING DIODES

(75) Inventors: Britta Goeoetz, Regensburg (DE); Karsten Diekmann, Rattenberg (DE); Robert Tress, Undorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/125,893

(22) PCT Filed: May 30, 2012

(86) PCT No.: PCT/EP2012/060090
§ 371 (c)(1),
(2), (4) Date: Feb. 5, 2014

(87) PCT Pub. No.: WO2012/171790
PCT Pub. Date: Dec. 20, 2012

(65) Prior Publication Data
US 2014/0203253 A1    Jul. 24, 2014

(30) Foreign Application Priority Data

Jun. 17, 2011  (DE) .......................... 10 2011 077 687

(51) Int. Cl.
| | | |
|---|---|---|
| *H01L 51/52* | (2006.01) | |
| *H01L 25/04* | (2014.01) | |
| *H01L 27/32* | (2006.01) | |
| *F21Y 105/00* | (2006.01) | |
| *F21Y 113/00* | (2006.01) | |

(52) U.S. Cl.
CPC .............. *H01L 51/52* (2013.01); *H01L 25/048* (2013.01); *H01L 27/32* (2013.01); *H01L 51/5203* (2013.01); *F21Y 2105/008* (2013.01); *F21Y 2113/00* (2013.01); *H01L 2251/5361* (2013.01); *H01L 2924/0002* (2013.01)

(58) Field of Classification Search
CPC ................... H01L 51/5203; H01L 2251/5361; H01L 27/32; H01L 25/048; H01L 2924/0002; H01L 51/52; H01L 51/0097; H01L 2224/85205; H01L 2224/85207; H01L 2224/45014
USPC ............................... 438/46; 257/40, 693–697
See application file for complete search history.

(56) References Cited

U.S. PATENT DOCUMENTS

| | | | | |
|---|---|---|---|---|
| 2002/0068191 A1* | 6/2002 | Kobayashi | .................... | 428/690 |
| 2008/0297072 A1* | 12/2008 | Snijder et al. | ................. | 315/312 |
| 2010/0045189 A1* | 2/2010 | Storch et al. | .................. | 315/149 |

(Continued)

FOREIGN PATENT DOCUMENTS

| | | |
|---|---|---|
| DE | 102006059168 A1 | 4/2008 |
| DE | 102007061473 A1 | 4/2009 |
| DE | 102010044738 A1 | 3/2012 |
| JP | 2007-329313 A | 12/2007 |

(Continued)

*Primary Examiner* — Peter Bradford
(74) *Attorney, Agent, or Firm* — Slater & Matsil, L.L.P.

(57) ABSTRACT

An organic light emitting diode includes a substrate and an organic layer sequence, which generates electromagnetic radiation during operation. The organic layer sequence is arranged in a central region of the substrate A metallization is arranged in an edge region of the substrate and is designed for making electrical contact with the organic layer sequence. A separately produced metallic contact structure is cohesively and electrically conductively connected to the metallization by a joining process based on ultrasonic technology.

14 Claims, 18 Drawing Sheets

(56) References Cited

U.S. PATENT DOCUMENTS

| | | |
|---|---|---|
| 2010/0046210 A1 | 2/2010 | Mathai et al. |
| 2010/0194645 A1* | 8/2010 | Steffen et al. .......... 343/700 MS |
| 2010/0264430 A1* | 10/2010 | Takamura ...................... 257/88 |
| 2010/0321937 A1* | 12/2010 | Van Bommel et al. ....... 362/235 |
| 2012/0075871 A1* | 3/2012 | Chen ............................. 362/362 |
| 2014/0111084 A1* | 4/2014 | Sung ............................. 313/512 |
| 2014/0231793 A1* | 8/2014 | Rajan et al. .................... 257/40 |

FOREIGN PATENT DOCUMENTS

| | | |
|---|---|---|
| WO | 2007135604 A2 | 11/2007 |
| WO | 2008040323 A2 | 4/2008 |
| WO | 2008090493 A1 | 7/2008 |
| WO | 2009094997 A1 | 8/2009 |
| WO | 2009095005 A1 | 8/2009 |
| WO | 2009095006 A1 | 8/2009 |
| WO | 2010034435 A1 | 4/2010 |

* cited by examiner

ORGANIC LIGHT EMITTING DIODE, METHOD FOR PRODUCING AN ORGANIC LIGHT EMITTING DIODE AND MODULE COMPRISING AT LEAST TWO ORGANIC LIGHT EMITTING DIODES

This patent application is a national phase filing under section 371 of PCT/EP2012/060090, filed May 30, 2012, which claims the priority of German patent application 10 2011 077 687.7, filed Jun. 17, 2011, each of which is incorporated herein by reference in its entirety.

TECHNICAL FIELD

A method for producing an organic light emitting diode, an organic light emitting diode and a module comprising at least two organic light emitting diodes are specified.

SUMMARY OF THE INVENTION

Embodiments of the present invention specify an organic light emitting diode with which electrical contact can be made in a simple manner. Further embodiments of the present invention specify a method for producing such a light emitting diode. Moreover, embodiments specify a module comprising at least two organic light emitting diodes where electrical contact is made with the organic light emitting diodes among one another in a simple manner.

An organic light emitting diode comprises: a substrate and an organic layer sequence, which generates electromagnetic radiation during operation. The organic layer sequence is arranged in a central region of the substrate. A metallization is arranged in an edge region of the substrate and is designed for making electrical contact with the organic layer sequence. A separately produced metallic contact structure is cohesively and electrically conductively connected to the metallization.

The organic layer sequence generally comprises a multiplicity of organic layers such as, for example, charge carrier conducting layers, charge carrier injecting layers and at least one emitter layer. The emitter layer generally generates electromagnetic radiation, usually visible light, during operation.

The organic layer sequence is generally arranged on a substrate. The substrate can be a glass sheet, for example. For the purpose of making electrical contact with the organic layer sequence, a first electrode layer is applied on the substrate and a second electrode layer is applied on that side of the layer sequence which faces away from the substrate. In this case, at least one of the two electrode layers is designed to be transmissive to the electromagnetic radiation generated in the emitter layer. An electrode layer which is transmissive to visible light can be formed, for example, from at least one transparent conductive oxide (TCO material).

Transparent conductive oxides are generally metal oxides such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can furthermore also be p- and n-doped.

Since the organic materials of the organic layer sequence—for instance in comparison with inorganic semiconductor materials—are sensitive toward external influences, such as liquids or gases, for instance, the organic light emitting diode generally has an encapsulation of the organic materials. An encapsulation can be formed by a cap, for example, which is connected to the substrate as gas-tightly and liquid-tightly as possible.

Furthermore, it is also possible for the organic light emitting diode to have a thin-film encapsulation. A thin-film encapsulation is generally constructed from at least one layer, which can be applied for example by means of a CVD process (Chemical Vapor Deposition) such as, for example, an ALD method (Atomic Layer Deposition). The thin-film encapsulation is preferably applied over the entire component and is generally designed to be electrically insulating. Thin-film encapsulations are described, for example, in the following documents, the disclosure content of which in this regard is incorporated by reference: DE 10 2010 044738, WO 2009/095005, WO 2009/094997, WO 2009/095006. Preferably, a cover glass is furthermore arranged on the thin-film encapsulation.

The metallization can be, for example, a layer which contains a metal or is formed from a metal. Furthermore, it is possible for the metallization to be constructed from a plurality of individual layers. In this case, each individual layer is particularly preferably likewise formed from a metal or contains a metal. The metallization comprises aluminum, for example. The metallization can be formed from an aluminum layer arranged between two comparatively thin chromium-containing layers. The metallization can be deposited by sputtering, for example.

In accordance with one embodiment of the organic light emitting diode, the metallization is applied on the first electrode layer and/or the second electrode layer. In this case, the metallization is provided for impressing electric current into the first electrode layer and/or the second electrode layer. The metallization is therefore particularly preferably arranged in direct contact with the first electrode layer and/or the second electrode layer.

Furthermore, electrical contact is generally made with the organic layer sequence via the metallization. For this purpose, in the present case the metallic contact structure is cohesively and electrically conductively connected to the metallization. In this case, the metallic contact structure is produced separately—for example by stamping—from the other elements of the organic light emitting diode and is then cohesively and electrically conductively connected to the metallization.

The contact-connection via the contact structure described here affords the advantage that the latter is very stable for instance compared with a pressure/spring contact-connection and occupies comparatively little space. Furthermore, the contact-connection of the metallization via the contact structure as described here is significantly simplified for example compared with a contact-connection of the metallization via a flexible conductor track fixed to the metallization by means of an additional electrically conductive adhesive film.

The contact structure, for example, comprises one of the following materials or consists of one of the following materials: aluminum, copper, brass, zinc, bronze, tin, silver, gold.

In accordance with one embodiment of the organic light emitting diode, the contact structure is electrically conductively and cohesively connected to the metallization at at least one connecting point. The connecting point has, for example, a size of between 0.5 mm×0.5 mm and 5 mm×5 mm inclusive.

In accordance with one embodiment of the organic light emitting diode, the contact structure is cohesively and electrically conductively connected to the metallization at at least one connecting point, wherein the connecting point comprises a material that differs from the rest of the material of the contact structure.

Preferably, the contact structure has a main structure, into which the connecting point is embedded, wherein the connecting point preferably comprises a material that differs from the material of the main structure. This affords the advantage that a material that is particularly well suited to connection to the metallization can be chosen for the connecting point, while the rest of the material, for example, ensures a particularly good mechanical stability of the entire contact structure or is particularly distinguished with respect to some other property, such as electrical conductivity, for instance.

In order to produce a particularly good cohesive and electrically conductive connection between the metallization and the contact structure, the connecting points particularly preferably comprise a comparatively ductile material. Aluminum, in particular in high-purity soft annealed form, is particularly suitable as material for the connecting point. Particularly preferably, the material of the connecting point has a comparatively high modulus of elasticity. High-purity soft annealed aluminum has, for example, a modulus of elasticity of approximately 70 GPa. However, it is also possible to use materials having a lower modulus of elasticity, for example of approximately 50 GPa or of approximately 60 GPa, for the connecting points.

However, such a comparatively ductile material generally has a low mechanical stability. Therefore, the main structure of the contact structure, into which the connecting point is embedded, is preferably formed from a different material. The main structure preferably contains one of the following materials or is preferably formed from one of the following materials: copper, brass, zinc, tin, bronze, silver, gold. These materials are generally particularly suitable for further-reaching contact-making.

Particularly preferably, a main structure which contains copper or is formed from copper is suitable for stabilizing the contact structure.

Furthermore, it is also possible for the contact structure to be constructed from different individual layers. By way of example, the contact structure can have two layers, the materials of which differ from one another. In this regard, the contact layer can have a first layer, the material of which is suitable in particular for connection to the metallization, while a second layer contains a material provided for mechanically stabilizing the contact structure. Preferably, the contact structure has a first layer comprising aluminum or formed from aluminum. Said first layer is generally provided for connection to the metallization. The second layer comprises, for example, one of the following materials or is formed from one of the following materials: copper, brass, zinc, tin, bronze, silver, gold.

In accordance with one embodiment, the contact structure is provided with an anticorrosion protective layer for protecting the contact structure against corrosion. Such an anticorrosion protective layer, for example, comprises tin or is formed from tin. An anticorrosion protective layer is particularly preferably provided if the contact structure comprises different materials.

In accordance with one embodiment of the contact structure, the contact structure is free of the anticorrosion protective layer at the connecting point. The anticorrosion protective layer can be applied to the contact structure before or after the production of the cohesive connection.

Particularly preferably, the contact structure has a thickness of between 50 µm and 400 µm inclusive. The width of the contact structure is, for example, between 0.5 mm and 5 mm inclusive. The width of the contact structure can be less than or greater than the width of the edge region of the substrate.

The thickness of the contact structure generally depends on the substrate. If glass is used as material for the substrate, then the energy input into the substrate glass in the case of comparatively thick contact structures is so high that the substrate glass can easily be damaged. If a substrate glass having a thickness of approximately 0.7 mm is used, for example, then generally contact structures having a thickness of up to 0.4 mm can be applied. If a substrate glass having a higher thickness is used, for example, having a thickness of approximately 1.6 mm, then thicker contact structures having a thickness of up to 1 mm inclusive can be applied.

Furthermore, the contact structure particularly preferably has a contact region designed for making further electrical contact externally. By way of example, the contact region is provided for electrically conductive connection to the contact region of a further organic light emitting diode. Particularly preferably, the contact region is free of a connecting point.

The contact region can be designed for example as a lug or as a lug having an opening, a so-called eye. Furthermore, the contact region can be designed in the form of a wire.

Particularly preferably, the contact structure has a main extension plane arranged parallel to a main area of the substrate. The contact region can be bent, for example, perpendicularly, preferably by approximately 90°, with respect to the main extension plane of the contact structure.

By way of example, the contact structure is applied along its main extension plane on the metallization and a contact region is bent in such a way that it runs along an edge of the organic light emitting diode, said edge running perpendicularly to the main area of the substrate. The edge can run for example parallel to a side area of the organic layer sequence. The edge can be formed by the side area of a cap for encapsulating the organic layer sequence. In this case, it is furthermore possible for the contact region to have a further bend, preferably again by 90°, such that the contact region runs further on a main area of the organic light emitting diode. Alternatively or additionally, it is also possible for the contact region to be bent in such a way that it runs perpendicularly to the main extension plane of the contact structure along a side area of the substrate.

In accordance with a further embodiment, the organic light emitting diode has a contact structure having a contact region which is bent perpendicularly to a main extension plane of the substrate and is furthermore arranged at an outer side of the contact structure.

Furthermore, it is also possible for the contact region to be bent in such a way that, proceeding from the main extension plane of the contact structure, said contact region runs along the edge of the substrate and has a further bend in the further progression, such that the contact region runs further parallel to a main extension plane of the contact structure above the latter. Such a contact region forms an L-shaped structure which projects perpendicularly from the main extension plane of the contact structure and over the latter.

In accordance with a further embodiment of the organic light emitting diode, the contact structure is of rod-shaped design. The main extension plane of a rod-shaped contact structure preferably runs parallel to a main area of the substrate. In this case, the contact structure can be designed and arranged in such a way that it projects over the substrate of the organic light emitting diode along a main extension plane of the contact structure. The projecting end of the contact structure can for example advantageously be used for electrically conductive connection to a further organic light emitting diode.

Furthermore, the contact structure is preferably embedded into a silicone material. This advantageously serves to protect the metallic contact structure against corrosion.

A method for producing an organic light emitting diode comprises, in particular, the following steps. A substrate is provided. An organic layer sequence is arranged in a central region. The organic layer sequence generates electromagnetic radiation during operation. A metallization is arranged in an edge region. The metallization is designed to make electrical contact with the organic layer sequence. A metallic contact structure is cohesively connected to the metallization, in such a way that an electrically conductive connection arises between the contact structure and the metallization.

The contact structure is preferably substantially formed from a metal tape. The term "substantially" in this case means that the contact structure is predominantly formed from the metal tape. However, it is also possible, for example, for a contact structure formed from a metal tape to be provided with further layers, for example for protection against corrosion.

The contact structure is stamped from the metal tape, for example. By virtue of the possibility of stamping out the contact structure, different design requirements made of the contact structure can advantageously be fulfilled in a simple manner.

In accordance with one embodiment of the method, the metal tape is formed from a single material. Alternatively, it is also possible for a main body of the metal tape to be formed from a first material, into which main body a second material is embedded, said second material differing from the first material. By way of example, strips of a different material can be incorporated into the main body of the metal tape. Particularly preferably, the first material and the second material are a metal.

If a contact structure is formed from a metal tape having a main body into which a different material is embedded, then the connecting points already described above are preferably formed from the material embedded into the main body.

The metal tape therefore preferably comprises one of the following materials or is formed from one of the following materials: aluminum, copper, brass, zinc, bronze, tin, silver, gold.

Preferably, the main body of the metal tape is formed from one of the following materials or comprises one of the following materials: copper, brass, zinc, tin, bronze, silver, gold. The material introduced into the main body is preferably aluminum, particularly preferably in high-purity soft annealed form.

By way of example, the contact structure can be formed from a metallic tape, the main body of which is formed from copper and into which aluminum tapes are incorporated for forming connecting points. Preferably, between one and eight aluminum tapes inclusive are incorporated into the main body in this case.

For producing a contact structure comprising a plurality of layers, use is preferably made of a roll-bonded metal tape. Such a roll-bonded metal tape generally has a layer structure having a first layer and a second layer, the materials of which differ from one another. By way of example, the first layer can contain copper and have a thickness of between 50 µm and 100 µm inclusive. The second layer can comprise aluminum, for example, and have a thickness of between 150 µm and 300 µm inclusive.

Preferably, the contact structure is cohesively connected to the metallization by a joining process based on ultrasonic technology such as, for example, ultrasonic welding, ultrasonic bonding and ultrasonic soldering. Ultrasonic welding and ultrasonic bonding are connecting techniques using ultrasound which are free of joining agent and in which the frequency ranges of the ultrasound used generally differ from one another. In the case of ultrasonic soldering, furthermore, in contrast to ultrasonic bonding and ultrasonic welding, a solder is generally used as joining agent.

The connecting point is therefore preferably designed to be ultrasonically weldable, ultrasonically bondable and/or ultrasonically solderable. By means of a joining process based on ultrasonic technology, an intermixing of the material of the metallization and of the material of the contact structure is preferably obtained at least partly at the connected locations. A connection between the metallization and the contact structure which was obtained by means of a joining process based on ultrasonic technology is demonstrable on the finished organic light emitting diode. By means of a joining process based on ultrasonic technology, there arises, in particular, a cohesive connection between contact structure and metallization which has good electrical conductivity. Particularly preferably, the cohesive connection between metallization and contact structure is obtained without the use of an additional connecting agent such as an adhesive or a solder. The connection between metallization and contact structure is therefore preferably free of an additional connecting agent such as an adhesive or a solder.

Furthermore, a joining process based on ultrasonic technology affords the advantage that a thin-film encapsulation possibly applied above the metallization can be penetrated in this case. Therefore, in the case of a connection between the contact structure and the metallization by means of a joining process based on ultrasonic technology, an electrically conductive connection can be obtained without a thin-film encapsulation, generally designed to be electrically insulating, having to be removed from the metallization beforehand in a separate step.

In accordance with one embodiment of the method, a metal tape is arranged as contact structure on the metallization, which metal tape is longer than the metallization and, if appropriate, projects beyond the substrate. In a further step, the metal tape is cohesively and electrically conductively connected to the metallization by means of a joining process based on ultrasonic technology, wherein the metal tape is preferably simultaneously trimmed.

An organic light emitting diode described here having a contact structure on the metallization is suitable, in particular, for being connected to at least one further organic light emitting diode to form a module.

Such a module comprises, in particular, at least two organic light emitting diodes, wherein each organic light emitting diode has a metallization in an edge region of a substrate, said metallization being designed for making electrical contact with an organic layer sequence, and wherein the two organic light emitting diodes are electrically conductively connected to one another via at least one separately produced metallic contact structure which is cohesively and electrically conductively connected to at least one of the metallizations.

Preferably, the electrical contact-connection described here between two organic light emitting diodes of a module does not simultaneously serve as a mechanical mount. As a result, it is advantageously possible to avoid a mechanical loading of the elements involved in the electrical contact-connection, such as the metallization and the contact structure, for instance.

Preferably, the module comprises an additional mechanical mount. The mount can be a frame, for example, which has cutouts for the organic light emitting diodes and in particular the radiation exit areas thereof. Particularly preferably, use is made of a frame comprising a main frame and a cover frame. In this case, the main frame preferably serves for emplacing and positioning the organic light emitting diodes. The cover frame preferably serves for covering the contact structures and possible spring connections.

Furthermore, a glass plate can be used as an additional mechanical mount, the organic light emitting diodes being adhesively bonded, for example, onto said glass plate.

By way of example, the two organic light emitting diodes can be electrically conductively connected to a rod-shaped contact structure, wherein the rod-shaped contact structure is electrically conductively and cohesively connected by one end to the metallization of one organic light emitting diode and by the other end to the metallization of the other organic light emitting diode. Such an electrical contact-connection of two organic light emitting diodes via a common rod-shaped contact structure is comparatively space-saving, in particular. Furthermore, such a contact-connection is suitable, in particular, for transparent organic light emitting diodes which are transmissive to visible light in the switched-off state.

In accordance with one embodiment of the module, each organic light emitting diode has a contact structure having a lug, via which the two organic light emitting diodes are electrically conductively connected. The lugs here can be designed for example in each case as an eye having an opening. The eye projects for example laterally over the substrate of the organic light emitting diode. The eyes of two adjacent organic light emitting diodes can be electrically conductively connected by means of a screw. Furthermore, it is also possible for the module to have a carrier to which an eye is in each case electrically conductively connected, for example by a screw connection.

In accordance with a further embodiment of the module, the contact structures and preferably the contact regions thereof are electrically conductively connected to one another by means of clamps or contact springs. This affords the advantage that the connection can easily be released again. By way of example, defective light emitting diodes of a module can thereby be changed in a simple manner.

If the contact regions are electrically conductively connected by means of springs, then compared with the direct connection of two metallizations by means of a spring, in which the spring is in direct contact with the two metallizations, this affords the advantage that the spring contact-connection has only a small mechanical interaction with the metallization and the organic layer sequence and can therefore only slightly damage these two elements.

In accordance with a further embodiment of the module, the spring contact-connections are covered by a mount or a rail. This serves to protect the spring contact-connection and improves the visual impression of the module.

In accordance with one embodiment of the contact structure, the contact region extends perpendicularly to a main extension plane of the contact structures at an outer side of the contact structure. Two adjacent organic light emitting diodes of a module each having such a contact structure can be electrically conductively connected to one another, for example, in that the contact regions are arranged in direct contact with one another and are fixed to one another by a clamp.

In accordance with a further embodiment of the contact structure, the contact regions are bent out of a main extension plane of the contact structures in an L-shaped manner. Two adjacent organic light emitting diodes of a module can be electrically conductively connected to one another, in that two regions—running parallel to one another—of the L-shaped contact regions are pushed over one another in direct contact and are connected by means of a clamp.

In accordance with a further embodiment of the organic light emitting diode, the contact structure is designed as a simple strip. Such a strip can project for example with one end over the metallization and over the substrate of the organic light emitting diode. If two such organic light emitting diodes of a module are arranged alongside one another in such a way that their projecting ends become located alongside one another, then the ends of the contact structures can be electrically conductively connected to one another by means of a clamp.

Two organic light emitting diodes of a module which each have a contact region which runs perpendicularly to a main extension plane of the contact structure along an edge arranged adjacent to the metallization can be electrically contact-connected, for example, by means of a contact spring tensioned between the edges. In this case, the contact spring is expediently arranged in such a way that it bears on both contact regions.

In accordance with a further embodiment of the module, said module comprises a frame having inserts provided for respectively accommodating an organic light emitting diode. In general, each organic light emitting diode of a module is introduced in an insert of a frame and latched there. In this case, a contact spring is arranged at each insert, said contact spring becoming located on the contact structure in the course of the organic light emitting diode being latched into the insert, such that an electrically conductive connection arises between the contact structure and the contact spring.

Furthermore, it is also possible for the organic light emitting diodes to be arranged in cutouts of a frame and to be fixed there with a cover.

Particularly in the case of non-transparent organic light emitting diodes which are not transmissive to light in the switched-off state, the organic light emitting diodes can be electrically contact-connected to one another via their rear sides. Particularly preferably, in this case a contact structure is arranged over the rear side of each organic light emitting diode.

It should be pointed out at this juncture that features explained in the present case only in conjunction with an organic light emitting diode can likewise be implemented in the method for producing an organic light emitting diode, in a method for producing a module of organic light emitting diodes and in the module of organic light emitting diodes.

Furthermore, it is also possible that features explained in the present case only in conjunction with a method for producing an organic light emitting diode can likewise be implemented in the organic light emitting diode itself, in a method for producing a module of organic light emitting diodes and in the module of organic light emitting diodes.

It is likewise clear to a person skilled in the art that features explained in the present case only in conjunction with a method for producing a module of organic light emitting diodes can likewise be implemented in the organic light emitting diode itself, in the method for producing an organic light emitting diode and in the module of organic light emitting diodes.

Finally, it is also clear that features explained in the present case only in conjunction with the module of organic light emitting diode can likewise be implemented in the organic light emitting diode itself, in the method for producing an organic light emitting diode and in a method for producing a module of organic light emitting diodes.

BRIEF DESCRIPTION OF THE DRAWINGS

Further advantageous embodiments and developments of the invention will become apparent from the exemplary embodiments described below in conjunction with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size in order to enable better illustration and/or in order to afford a better understanding.

DETAILED DESCRIPTION OF ILLUSTRATIVE EMBODIMENTS

Figure 1:
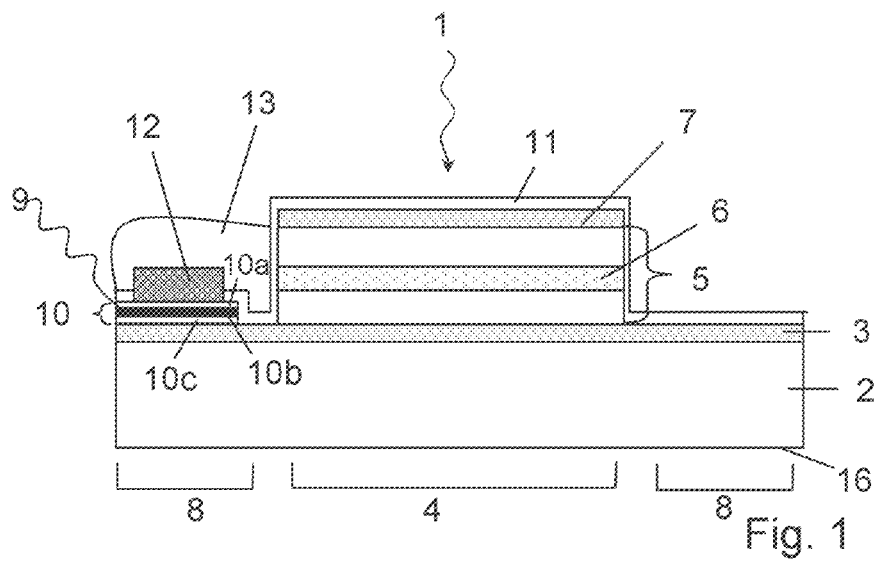
FIGS. 1 and 2 show a schematic sectional illustration of an inorganic light emitting diode in accordance with a respective exemplary embodiment.

The organic light emitting diode 1 in accordance with the exemplary embodiment in FIG. 1 has a substrate 2, on which a first electrode layer 3 is applied. The first electrode layer 3 comprises a TCO material, for example, and is particularly preferably transmissive to visible light.

In a central region 4 of the substrate 2, an organic layer sequence 5 is applied on the first electrode layer 3. The organic layer sequence 5 comprises a plurality of organic individual layers, in particular an emitter layer 6, which emits electromagnetic radiation, preferably visible light, during the operation of the organic light emitting diode 1. A second electrode layer 7 is applied on the organic layer sequence 5, said second electrode layer preferably likewise having good transmissivity to visible light.

Laterally with respect to the organic layer sequence 5, in an edge region 8 of the substrate 2, a metallization 9 is applied to the first electrode layer 3. In the present case, the metallization 9 is applied to the first electrode layer 3 in direct contact and is provided for impressing current into the first electrode layer 3.

In the present case, the first electrode layer 3 is formed both in the central region 4 of the substrate 2 and in the edge region 8 of the substrate 2.

In the case of the organic light emitting diode 1 of the present exemplary embodiment, the metallization 9 is formed by a metallic layer 10 constructed from three different individual layers 10a, 10b, 10c. In this case, the middle individual layer 10b comprises aluminum, while the two outer individual layers 10a, 10c, between which the aluminum-containing individual layer 10b is arranged, comprise chromium. The two chromium-containing individual layers 10a, 10c are approximately 50 mm thick, for example, while the aluminum-containing individual layer 10b is approximately 400 nm thick, for example. The entire metallization 9 therefore has a thickness of approximately 0.5 µm, for example.

Furthermore, a thin-film encapsulation 11 is arranged above the organic layer sequence 5 and above the edge regions 8 of the substrate 2 in order, in particular, to protect the organic materials of the organic layer sequence 5 against environment influences such as gases and liquids.

Furthermore, a separately produced metallic contact structure 12 is applied to the metallization 9 and is cohesively and electrically conductively connected to the metallization 9. In this case, the metallic contact structure 12 completely penetrates through the thin-film encapsulation 11.

Furthermore, the metallization 9 is embedded into a silicone material 13. The silicone material 13 serves to protect the metallic contact structure 12 against corrosion.

Figure 2:
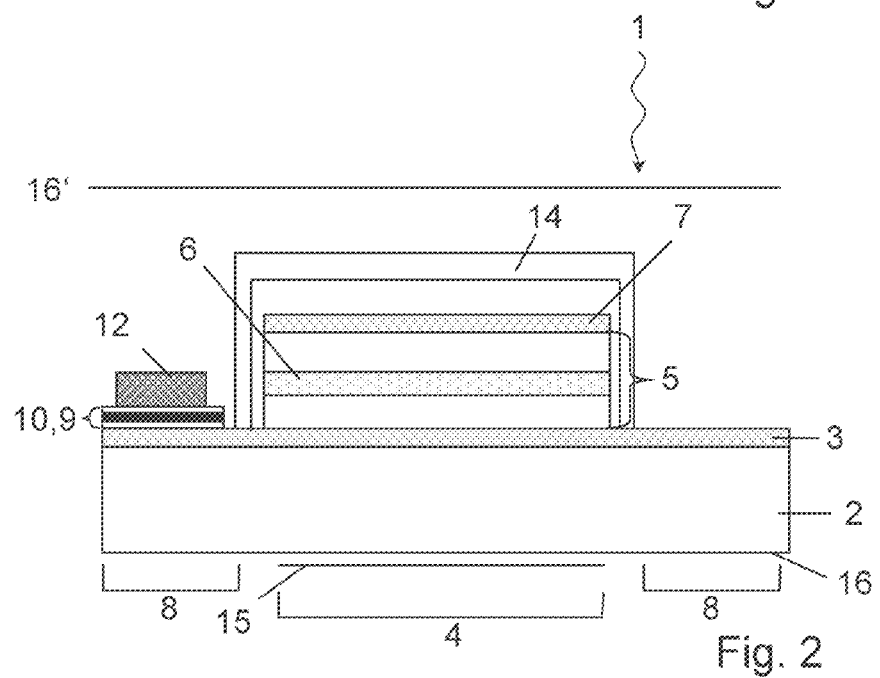

In the case of the organic light emitting diode 1 in accordance with the exemplary embodiment in FIG. 2, instead of a thin-film encapsulation 11, a cap 14 is arranged above the organic layer sequence 5. The cap 14 can be produced from glass, for example, and can be adhesively bonded to the substrate 2.

A radiation exit area 15 of the organic light emitting diode 1 as illustrated in FIGS. 1 and 2, for example, can be arranged at the front side of the organic light emitting diode 1, said front side being formed by the outer area 16 of the substrate 2. Furthermore, it is additionally or alternatively also possible for the radiation exit area 15 to be arranged at a rear side 16' of the organic light emitting diode, situated opposite the front side. In this case, the radiation exit area 15 is preferably formed at least over the central region 4, while the edge region 8 of the organic light emitting diode 1 is not provided for the emission of radiation.

Furthermore, it is also possible for the organic light emitting diode 1 to be designed to be substantially transmissive to visible light in the switched-off state at least in the region of its radiation exit area 15.

Figure 3A:
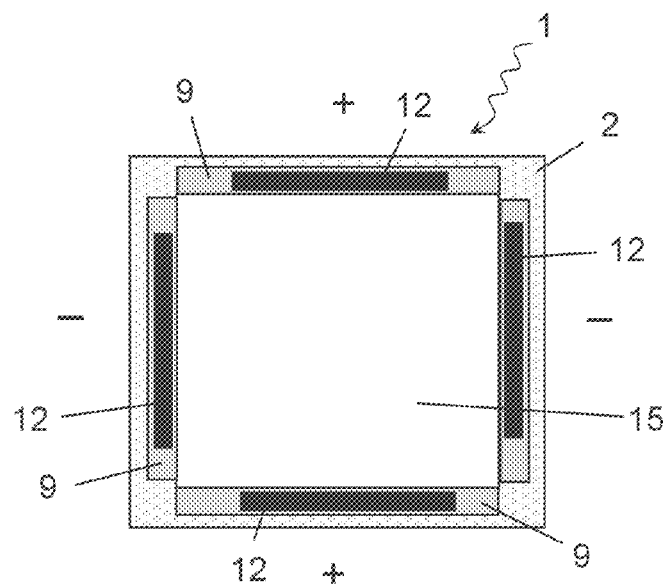
FIGS. 3A and 3B show a schematic plan view of an organic light emitting diode in accordance with a respective further exemplary embodiment.

The organic light emitting diode 1 in accordance with the exemplary embodiment in FIG. 3A has a rectangular basic shape with a rectangular substrate 2 and a likewise rectangular radiation exit area 15. The radiation exit area 15 is arranged in a central region 4 of the light emitting diode 1. Laterally with respect to the radiation exit area 15, in each case in an edge region 8 a metallization 9 is arranged on the substrate 2. Furthermore, a contact structure 12 is applied to each metallization 9, said contact structure being cohesively and electrically conductively connected to the metallization 9. Metallizations 9 respectively situated opposite one another are in this case respectively provided with the same polarity.

Figure 3B:
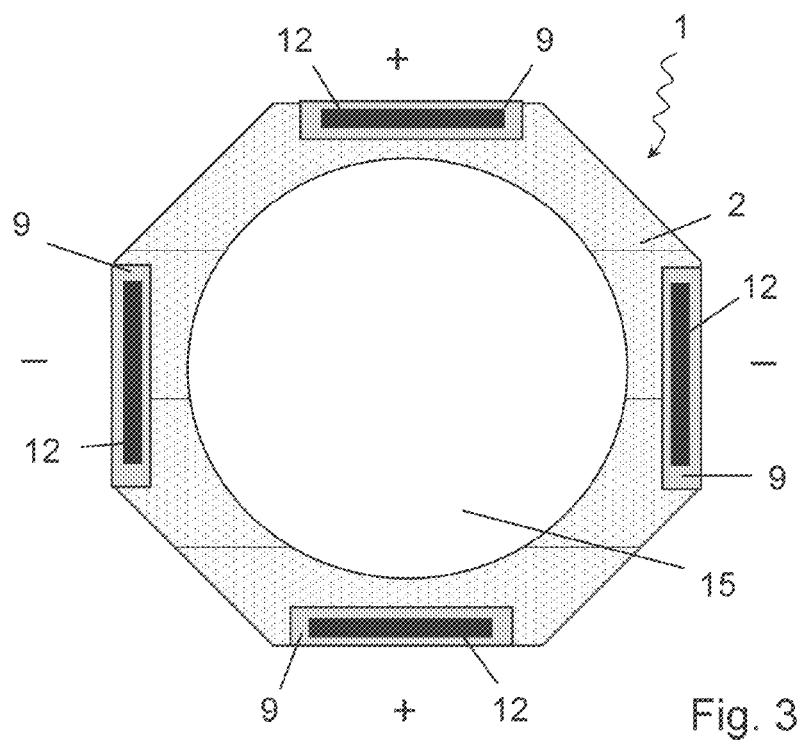

In contrast to the exemplary embodiment in FIG. 3A, the organic light emitting diode 1 in accordance with the exemplary embodiment in FIG. 3B has an octagonal basic shape with an octagonal substrate 2, while the radiation exit area 15 is designed such that it is round, preferably circular. At four respective sides of the octagonal basic shape, metallizations 9 are arranged in the edge regions 8 of the substrate 2, said metallizations being provided for making electrical contact with the organic layer sequence 5 in the central region 4 of the substrate 2. Metallizations 9 respectively situated opposite one another are in this case once again respectively provided with the same polarity.

Figure 4:
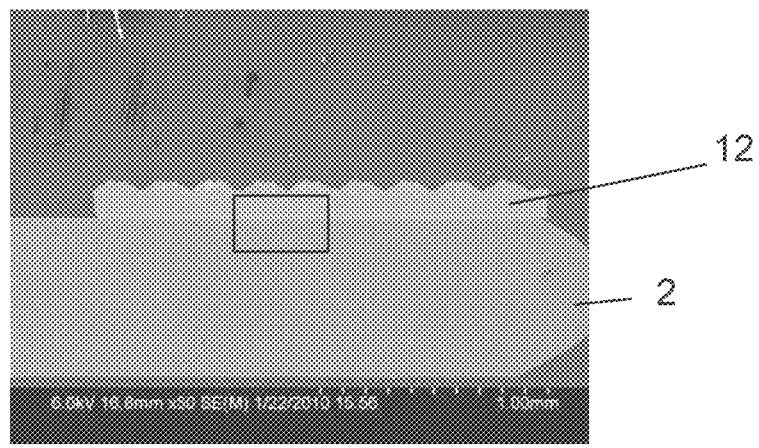
FIG. 4 shows by way of example a micrograph recorded by a scanning electron microscope of an ultrasonically welded connection between a contact structure and a metallization.
Figure 5:
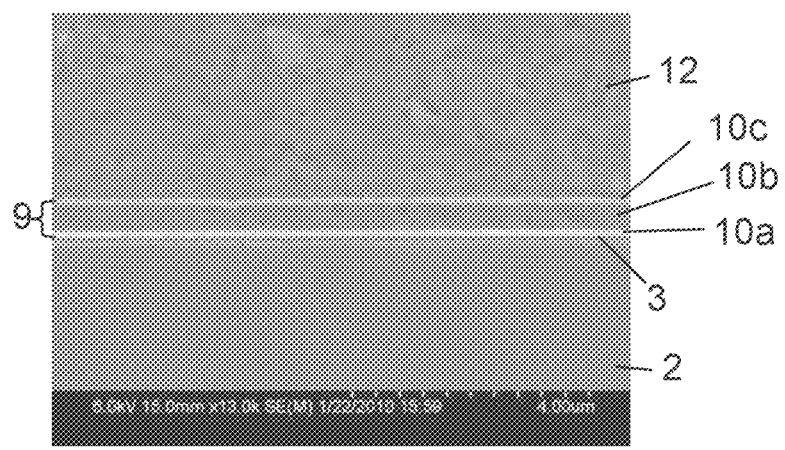
FIG. 5 shows the excerpt (marked in FIG. 4) from the micrograph recorded by a scanning electron microscope in FIG. 4 in a different magnification.

The micrographs recorded by a scanning electron microscope in FIGS. 4 and 5 show by way of example and as excerpts a separately produced contact structure 12, which is cohesively and electrically conductively connected to a metallization 9. The metallization 9 is arranged in an edge region 8 of a substrate 2.

The organic light emitting diode illustrated as an excerpt in FIGS. 4 and 5 comprises a substrate 2, which is formed from glass in the present case. A first electrode layer 3, which is formed from ITO, is arranged on the glass substrate 2. A metallization 9 constructed from three individual layers 10a, 10b, 10c is applied to the first electrode layer 3. In this case, the metallization 9 comprises an aluminum-containing individual layer 10b arranged between two comparatively thin chromium-containing individual layers 10a, 10c. Finally, a separately produced aluminum-containing contact structure 12 is cohesively and electrically conductively applied to the metallization 9, for example by ultrasonic welding, ultrasonic bonding or ultrasonic soldering. As shown in FIG. 5, in particular, a very tight connection between the metallization 9 and the contact structure 12 is produced in this case.

Figure 6:
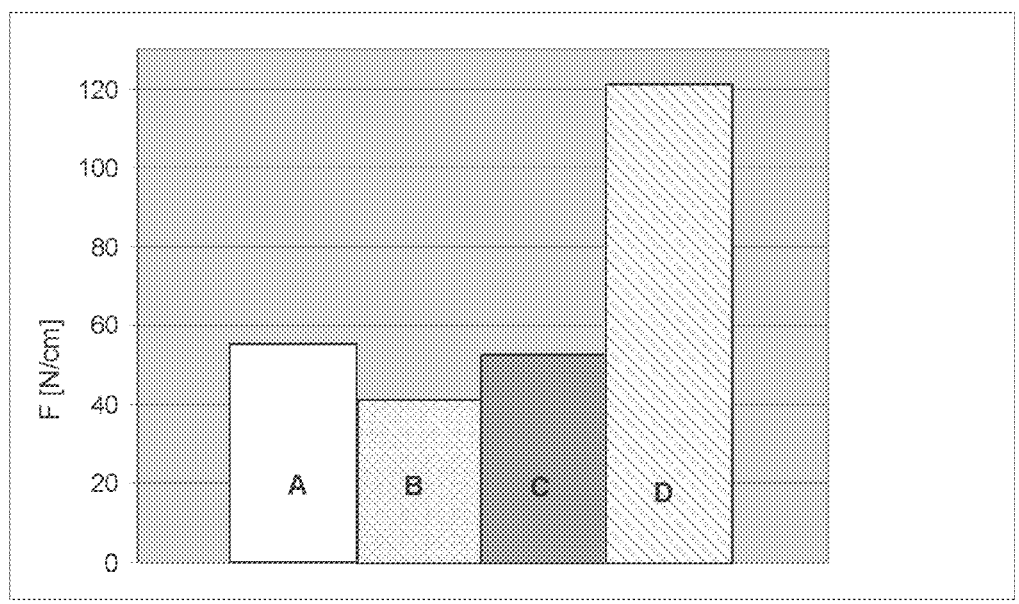
FIG. 6 shows by way of example measured values of the peel force F in N/cm of four different ultrasonically welded connections between a metallization and a contact structure.

FIG. 6 shows averaged measured values of peel forces F for different samples A, B, C and D of contact structures 12 on a metallization 9. The measured force per width of the contact structure 12 is indicated here. In the present case, the samples A, B and C of the contact structures 12 are formed from an aluminum tape, for example by stamping. By contrast, the sample D of the contact structure 12 is produced from a metal tape which is a composite material comprising aluminum and copper. By way of example, the contact structure D can be a metal tape in which an aluminum tape is roll-bonded with a copper tape. Such a contact structure 12 is described further below, for example, with reference to FIG. 10.

The measured peel forces for contact structures 12 formed substantially from aluminum in the case of the samples A, B, C in FIG. 6 are between approximately 40 N/cm and approximately 60 N/cm inclusive, while the peel force for a contact structure 12 composed of a composite material is above 120 N/cm. By using a composite material containing for example an element of copper and elements of aluminum, it is therefore advantageously possible to significantly improve the strength of the connection between the metallization 9 and the contact structure 12.

In particular, the peel force F of a contact structure 12 described here is significantly increased compared with a contact-connection of the metallization 9 via a conductor track fixed to the metallization 9 by means of a separate adhesive film. The peel force of a contact-connection via such a conductor track fixed by means of an adhesive film is approximately 15 N/cm.

Figure 7:
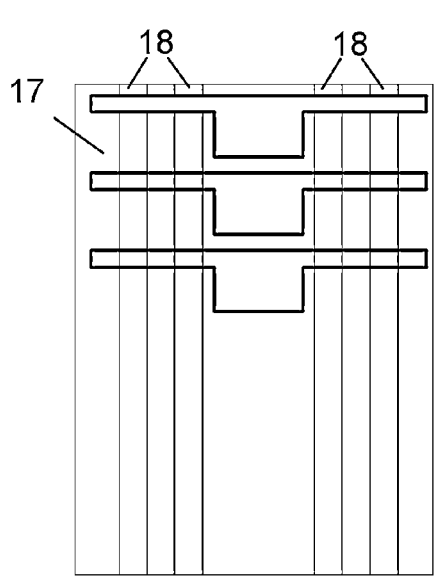
FIGS. 7 to 9 show an exemplary embodiment of a method for producing a contact structure.
Figure 9:
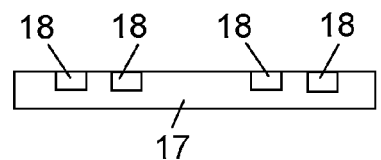

FIG. 7 shows a schematic plan view of a metal tape in accordance with one exemplary embodiment. The metal tape is a composite material having a main body 17, which is produced from copper in the present case. Further strip-shaped metal tapes 18, produced from aluminum in the present case, are incorporated into the main body 17. A schematic cross section of this metal tape is illustrated in FIG. 9. In this case, the aluminum strips 18 are embedded in the copper-containing main body 17 and do not completely penetrate through the main body 17.

Figure 8:
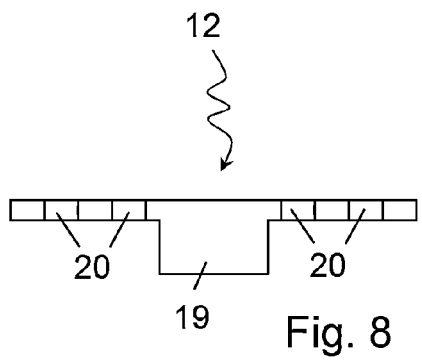

A metallic contact structure 12 is then produced separately from the metal tape by stamping. In this case, the stamped-out contact structure 12 has a contact region 19 provided for making electrical contact externally later (FIG. 8). Rod-shaped regions running along a main extension plane of the contact structure 12 are arranged laterally with respect to the contact region 19. Connecting points 20 formed from aluminum are arranged within the rod-shaped regions. In this case, the connecting points 20 are formed by the stamped out regions of the embedded aluminum-containing tape 18, while a main structure 21 of the contact structure 12 is shaped from the copper-containing main body 17 of the metal tape. In this case, the contact region 19 is free of connecting points 20.

Figure 10:
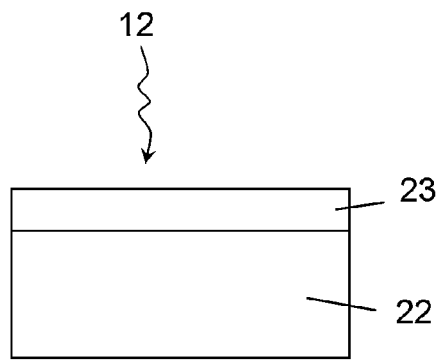
FIG. 10 shows a schematic sectional illustration through a contact structure in accordance with a further exemplary embodiment.

In contrast to the contact structure 12 in FIG. 8, the contact structure 12 in accordance with the exemplary embodiment in FIG. 10 has a layer structure. The contact structure 12 comprises a first layer 22, which contains aluminum in the present case, and a second layer 23, which contains copper in the present case. Preferably, the aluminum-containing layer 22 is in this case three times as thick as the copper-containing layer 23. By way of example, the copper-containing layer 23 has a thickness of approximately 50 μm and the aluminum-containing layer 22 has a thickness of approximately 150 μm. Such a contact structure 12 can be produced from a metal tape, for example, in which an aluminum tape is roll-bonded with a copper tape.

Figure 11:
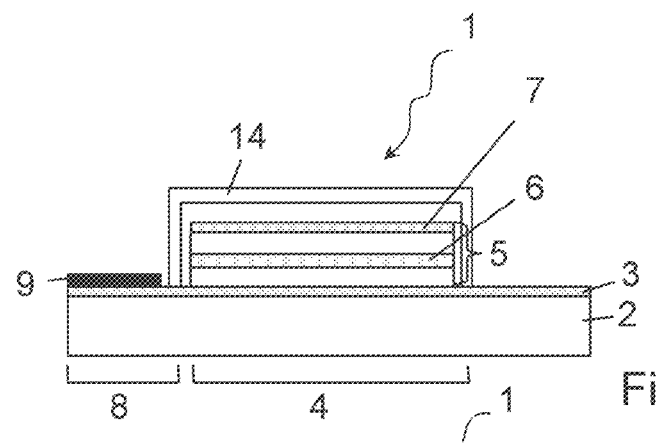
FIGS. 11 to 13 show an exemplary embodiment for producing an organic light emitting diode.
Figure 12:
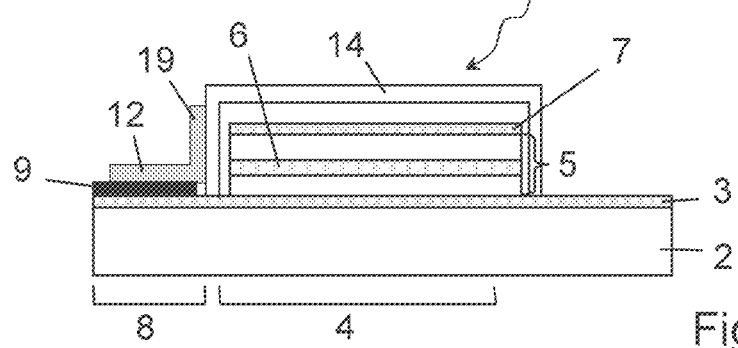
Figure 13:
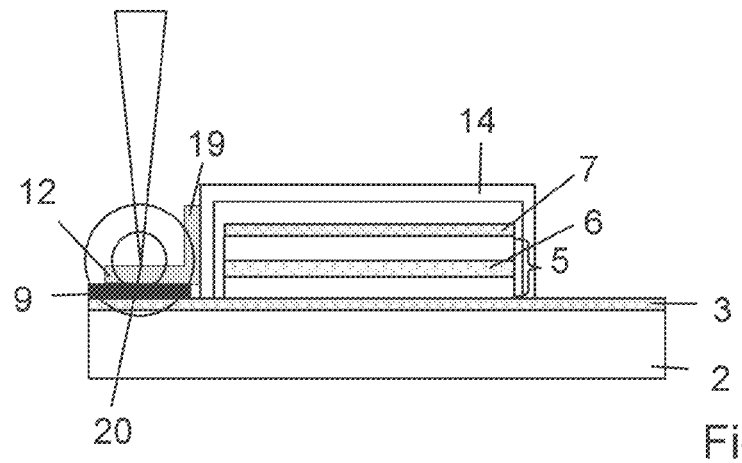

In the method for producing an organic light emitting diode 1 in accordance with the exemplary embodiment in FIGS. 11 to 13, a first step involves providing an organic light emitting diode 1 having a substrate 2, in which an organic layer sequence 5 is arranged in a central region 4, said organic layer sequence generating electromagnetic radiation during operation. A metallization 9 is arranged in an edge region 8 of the substrate 2, said metallization being designed for making electrical contact with the organic layer sequence 5 (FIG. 11).

In a next step, a metallic contact structure 12 is produced, as already described in detail with reference to FIGS. 7 to 9.

The contact structure 12 is arranged on the metallization 9 of the organic light emitting diode 1, (FIG. 12). In this case, the contact region 19 of the contact structure 12 is bent in such a way that the contact region 19 is led perpendicularly to a main extension plane of the contact structure 12 along a side area of the glass cap 14 of the organic light emitting diode 1.

In a next step, the contact structure 12 is ultrasonically welded at the connecting points 20, such that a cohesive, electrically conductive connection between metallization 9 and contact structure 12 arises at the connecting points 20 (FIG. 13).

Figure 14:
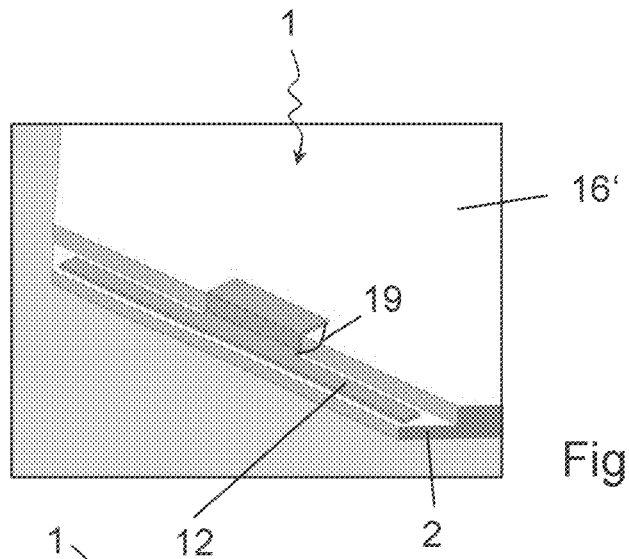
FIGS. 14 to 18 show in each case by way of example an excerpt from an organic light emitting diode in a perspective view.

The organic light emitting diode 1 in accordance with the exemplary embodiment in FIG. 14 has an octagonal basic shape. Such an organic light emitting diode 1 has already been described, for example, with reference to FIG. 3B. The excerpt in FIG. 14 in this case shows an edge region 8 of the substrate 2, on which a separately produced metallic contact structure 12 cohesively connected to a metallization 9 (not illustrated in the Figure) is applied. The contact structure 12 has a contact region 19, which, proceeding from the substrate 2, is bent perpendicularly to a main extension plane of the metallic contact structure 12 along an edge 24 of the organic light emitting diode 1. In the further course of the contact region 19, the latter is bent again, such that a further region of the contact region 19 becomes located on a rear side 16' of the organic light emitting diode 1.

Figure 15:
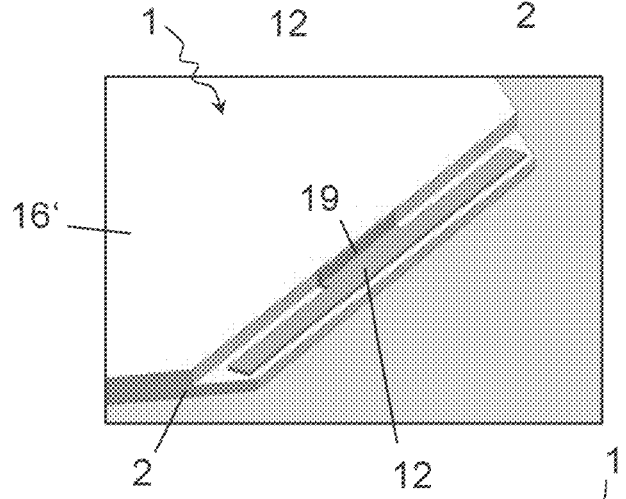

In the case of the organic light emitting diode 1 in accordance with the exemplary embodiment in FIG. 15, the contact region 19 of the contact structure 12, in contrast to the light emitting diode in accordance with FIG. 14, is bent only once in such a way that it runs along the edge 24 of the organic light emitting diode 1. In this case, the edge 24 of the organic light emitting diode generally follows a side area of the organic layer sequence 5. In the present case, the contact region 19 terminates flush with the rear side 16' of the organic light emitting diode 1.

Figure 16:
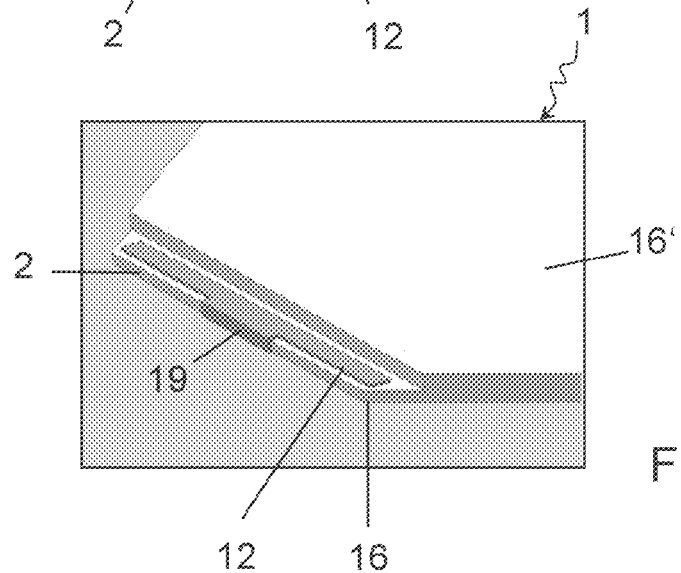

In contrast to the exemplary embodiments in FIG. 14 and FIG. 15, the contact region 19 in the case of the organic light emitting diode 1 in accordance with FIG. 16 is bent perpendicularly to a main extension plane of the contact structure 12 in such a way that it runs along a side area of the substrate 2. In this case, the contact region 19 terminates flush with the rear side 16 of the organic light emitting diode 1.

Figure 17:
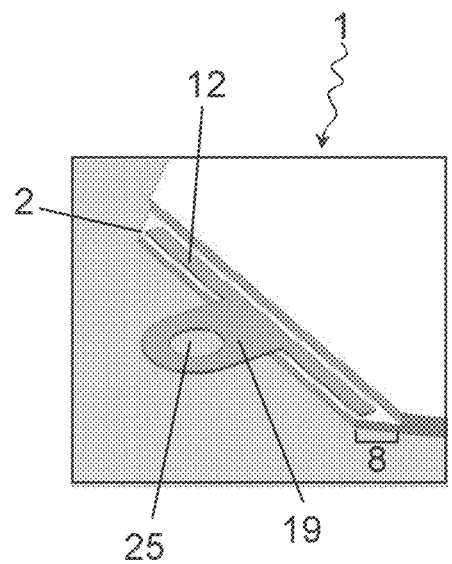

In contrast to the organic light emitting diodes in accordance with FIGS. 14 to 16, the organic light emitting diode 1 in accordance with the exemplary embodiment in FIG. 17 has a contact region 19 designed as an eye. The eye has an opening 25, by means of which the organic light emitting diode 1 can be fixed to another element, for instance, to a further organic light emitting diode 1 or else to a carrier. In the case of the organic light emitting diode 1 in accordance with FIG. 17, the contact region 19 is arranged centrally with respect to the side area of the organic light emitting diode 1. The contact region 19 further more projects laterally over the edge region 8 of the substrate 2.

Figure 18:
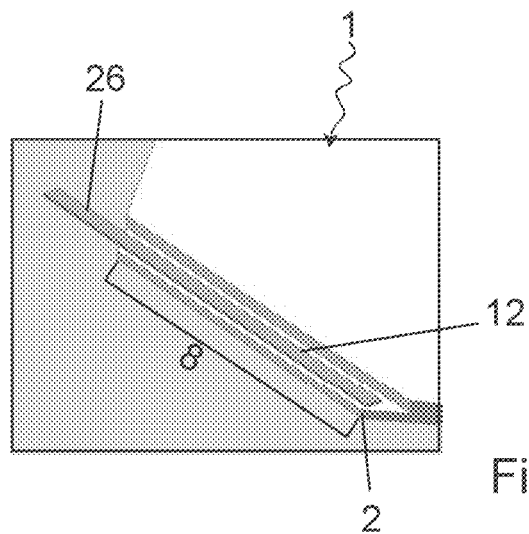

The organic light emitting diode 1 in accordance with the exemplary embodiment in FIG. 18 is provided with a metallic contact structure 12 designed in a rod-shaped manner. In this case, the contact structure 12 is longer than the edge region 8 of the organic light emitting diode 1, such that the contact structure 12 projects beyond the edge region 8 of the substrate 2. Such a projecting end 26 can advantageously be used for connection to a further organic light emitting diode 1. This is explained, by way of example, further below with reference to FIG. 24.

Figure 19:
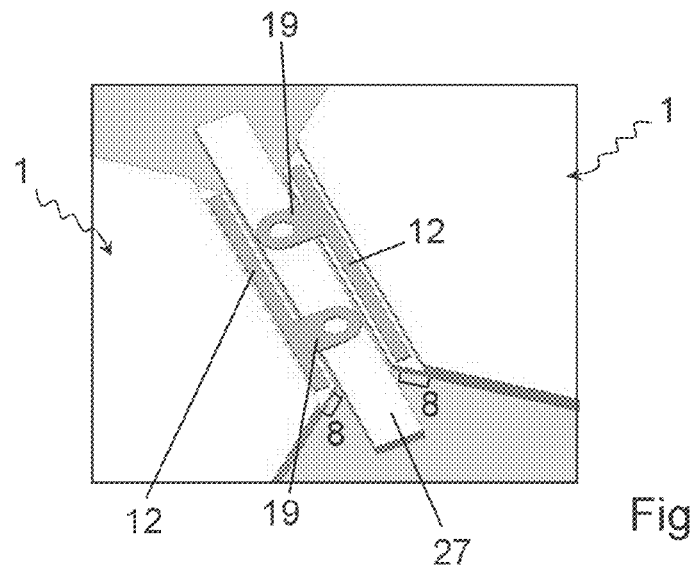
FIGS. 19 to 25 show in each case as excerpts schematic perspective illustrations of a light emitting diode module in accordance with various exemplary embodiments.

The module in accordance with the exemplary embodiment in FIG. 19 in the present case comprises at least two organic light emitting diodes 1 having an octagonal basic shape. Each organic light emitting diode 1 has a contact structure 12 applied along its main extension plane on the metallization 9 of the respective light emitting diode 1. Furthermore, each contact structure 12 has an eye projecting laterally beyond the substrate 2 of the organic light emitting diode 1 and provided as contact region 19. The two organic light emitting diodes 1 are arranged parallel to one another with their edge regions 8, to which the contact structures 12 are respectively applied, wherein the contact regions 19 become located in a manner offset with respect to one another. The two eyes are in each case arranged on a rod-shaped connecting element 27, which is preferably designed to be electrically conductive, such that an electrically conductive connection arises via the connecting element 27 and via the eyes. The eyes can be electrically conductively connected to the connecting element 27 by means of screw connections, for example. The screw connection is not illustrated in FIG. 19 for reasons of clarity.

Figure 20:
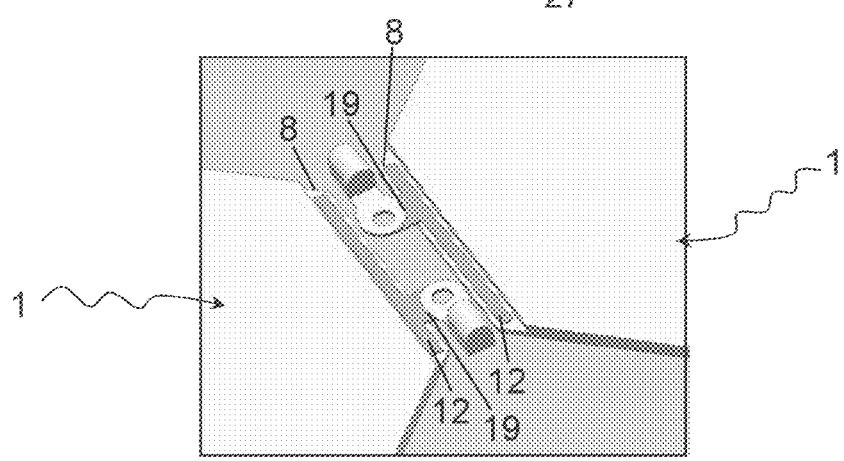

In the case of the module in accordance with the exemplary embodiment in FIG. 20, in contrast to the exemplary embodiment in FIG. 19, no connecting element 27 is provided. Instead, the eyes are electrically conductively connected via a screw connection via further eyes, which can likewise be fixed to a carrier, for example. The screws are not illustrated in the Figure in this case for reasons of clarity.

In the case of the modules in accordance with the exemplary embodiments in FIG. 19 and FIG. 20, the eyes of the adjacent contact structures 12 are arranged in a manner offset with respect to one another.

Figure 21:
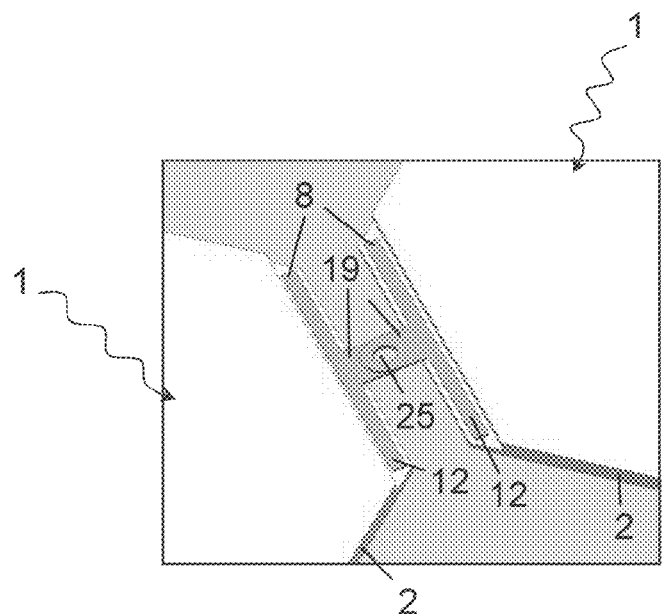

The module in accordance with the exemplary embodiment in FIG. 21 has two light emitting diodes 1, in which a contact structure 12 is in each case applied to a metallization 9 along its main extension plane. Each contact structure 12 has a centrally arranged eye as contact region 19. In this case, the organic light emitting diodes 1 are arranged in such a way that the openings 25 of the eyes overlap. The latter can then be electrically conductively contact-connected to one another by means of a screw connection. The screw connection is once again not illustrated in FIG. 21 for reasons of clarity.

Figure 22:
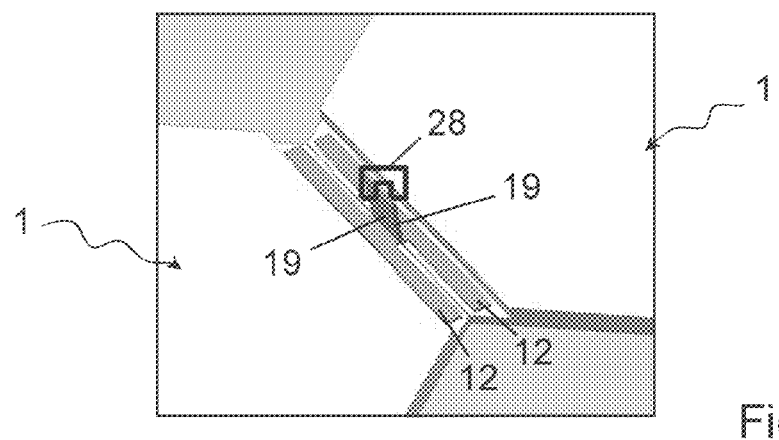

The organic light emitting diodes 1 of the module in accordance with the exemplary embodiment in FIG. 22 again have contact structures 12 having two contact regions 19 designed in an identical way. In this case, the contact regions 19 are bent by 90° out of a main extension plane of the contact structure 12. The contact regions 19 are arranged at an outer side of the organic light emitting diode 1. The organic light emitting diodes 1 are furthermore arranged in such a way that the two metallizations 9 run parallel to one another and the two contact regions 19 are in direct contact with one another. The two contact regions 19 are connected to one another by means of an electrically conductive clamp 28. An electrically conductive connection between the two organic light emitting diodes arises in this way.

Figure 23:
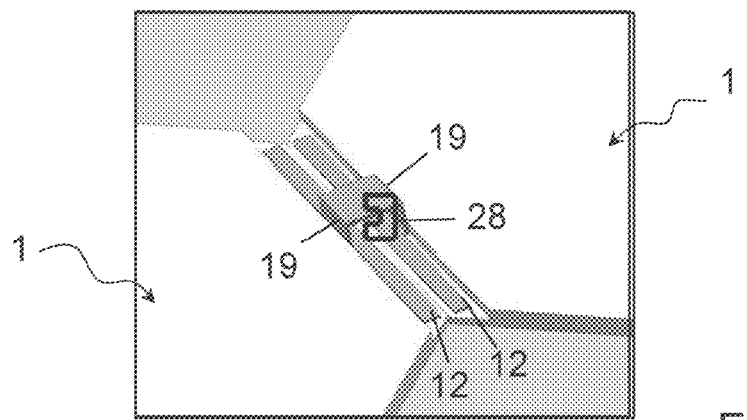

The organic light emitting diodes 1 of the module in accordance with the exemplary embodiment in FIG. 23 in each case have an L-shaped contact region 19 bent out of a main extension plane of the contact structure 12. In this case, the L-shaped contact regions 19 are arranged centrally with respect to the side area of the organic light emitting diode 1. In the present case, the L-shaped contact regions 19 are pushed over one another in such a way that they overlap at least within an upper region. The contact regions 19 are in direct contact with one another in this case. The contact regions 19 are electrically conductively connected to one another by means of a clamp 28.

Figure 24:
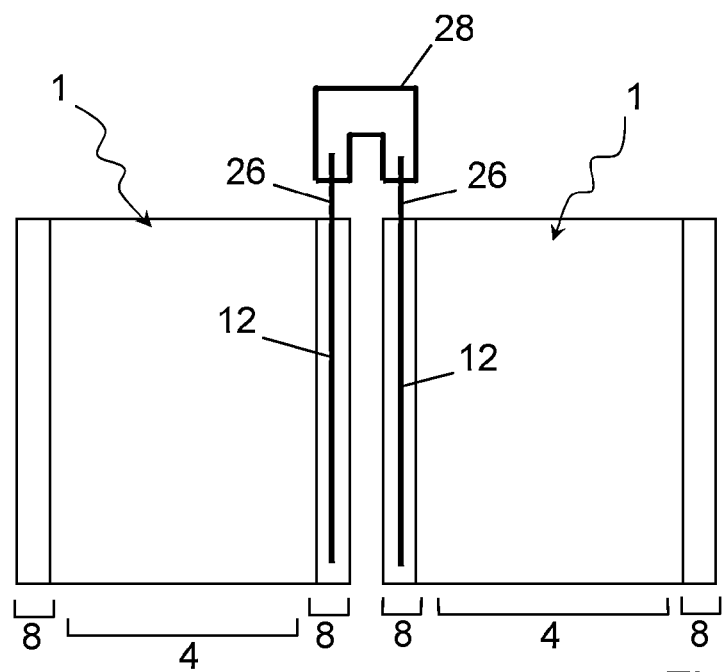

The module in accordance with the exemplary embodiment in FIG. 24 has two organic light emitting diodes 1 having a rod-shaped contact structure 12, wherein in each case one end 26 of the contact structure 12 projects over the respective substrate 2. The two organic light emitting diodes 1 are arranged alongside one another in such a way that the projecting ends 26 of the contact structures 12 run parallel to one another. The two projecting ends 26 are electrically conductively connected to one another by means of a clamp 28.

Figure 25:
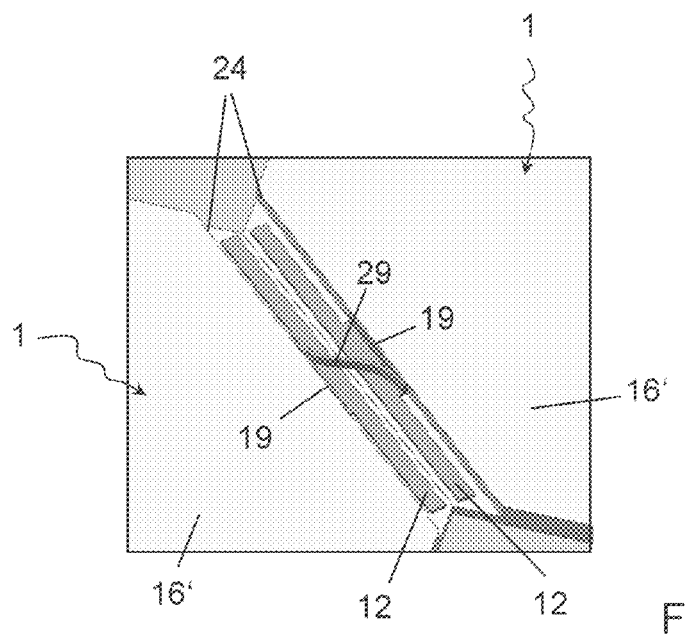

The organic light emitting diodes 1 in the case of the module in accordance with the exemplary embodiment in FIG. 25 in each case have a contact structure 12 having a contact region 19 which runs along an edge 24 of the organic light emitting diode 1 perpendicularly to a main extension plane of the contact structure 12 and terminates flush with the rear side 16' of the organic light emitting diode 1. In this case, the two organic light emitting diodes 1 are arranged in such a way that their two contact structures 12 run parallel to one another along their main extension planes. An electrically conductive spring 29 is clamped between the edges 24 of the two organic light emitting diodes 1, and furthermore becomes located on the contact regions 19. The two contact regions 19 of the organic light emitting diodes 1 are electrically conductively connected to one another via the spring 29.

Figure 26:
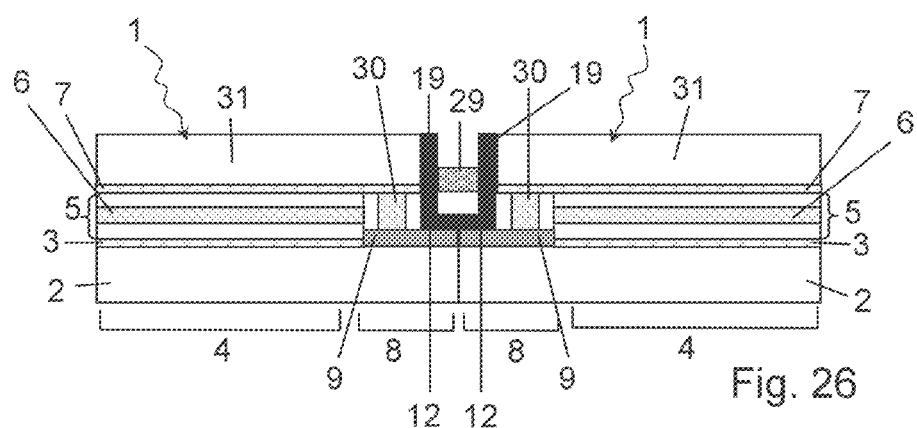
FIG. 26 shows a schematic sectional illustration of the light emitting diode module in accordance with the exemplary embodiment in FIG. 25.

FIG. 26 shows the module in accordance with FIG. 25 in cross section. Each light emitting diode 1 has a substrate 2, on which a first electrode layer 3 is arranged. On the first electrode layer 3 there is applied in each case an organic layer sequence 5 having an emitter layer 6 in a central region 4 of the substrate 2. Furthermore, a second electrode layer 7 is arranged on the organic layer sequence 5, said second electrode layer being electrically conductively connected via a further electrically conductive layer 30 to a metallization 9 in an edge region 4 of the substrate 2. In contrast to the organic light emitting diodes 1 in FIGS. 1 and 2, the first electrode layer 3 is not present in the edge region 8 of the substrate 2 and is therefore not in electrically conductive contact with the metallization 9. Rather, the second electrode layer 7 is electrically conductively connected to the metallization 9. Furthermore, the organic light emitting diodes 1 of the module in accordance with FIG. 26 have a further glass plate 31 as encapsulation.

The cross section in accordance with FIG. 26 furthermore shows the two contact regions 19 bent out of the main extension plane of the contact structures 12 and each running along an edge 24 of the organic light emitting diode 1. The two contact regions 19 are electrically conductively connected by means of the spring 29.

Figure 27:
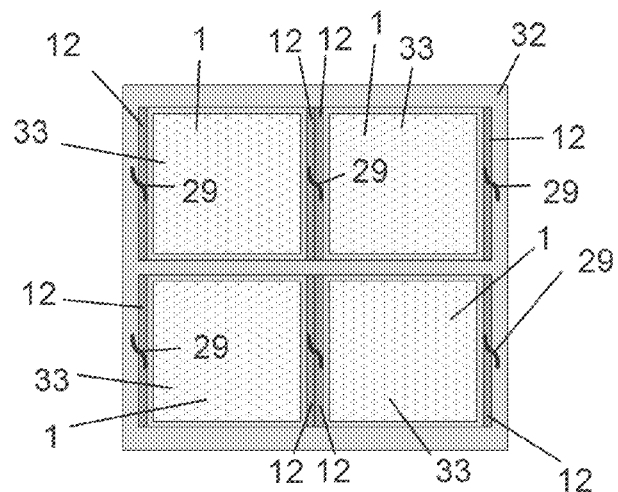
FIGS. 27 to 29 show a method for producing a module of organic light emitting diodes by way of example.
Figure 28:
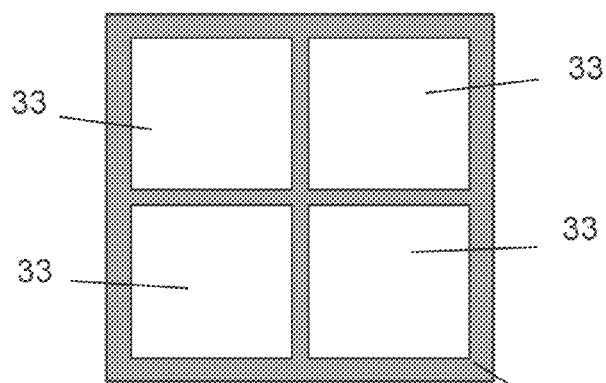
Figure 29:
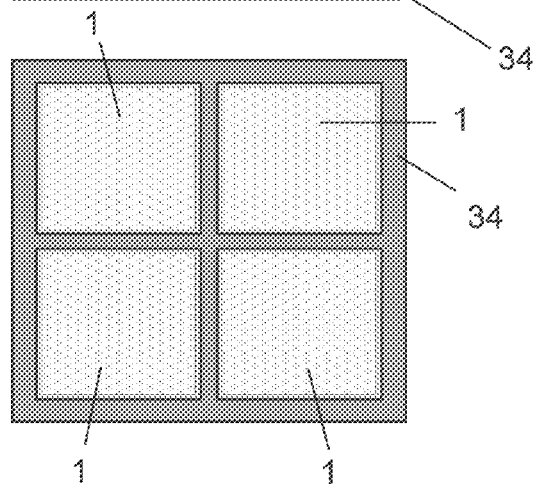
Figure 30:
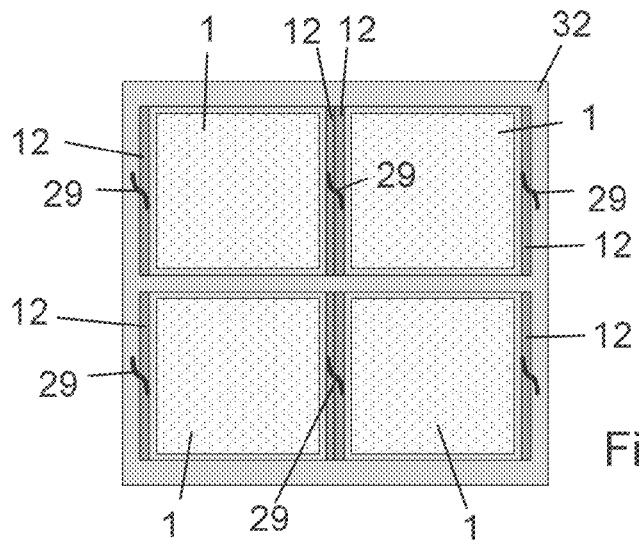
FIGS. 30 to 32 show a further method for producing a module of organic light emitting diodes by way of example.

In the case of the method in accordance with the exemplary embodiment in FIGS. 27 to 29, a main frame 32 is provided as an additional mechanical mount having four cutouts 33, wherein an organic light emitting diode 1 is introduced into each cutout 33. Each organic light emitting diode 1 has two contact structures 12 applied, at opposite edge regions 8 of the organic light emitting diodes 1, to the metallization 9 arranged there. Directly adjacent contact structures 12 of different organic light emitting diodes 1 are in each case electrically conductively connected to one another by means of a spring 29, as already described in detail with reference to FIGS. 25 and 26. Contact structures 12 in edge regions 8 which are arranged directly adjacent to the frame 32 are likewise electrically conductively connected to the frame 32 by means of springs 29.

Furthermore, a cover frame 34 is provided, which likewise has cutouts 33 for the radiation exit areas 15 of the organic light emitting diodes 1 (FIG. 28).

In a next step, the cover frame 34 is arranged on the main frame 32 and mechanically fixedly connected thereto (FIG. 29).

Figure 31:
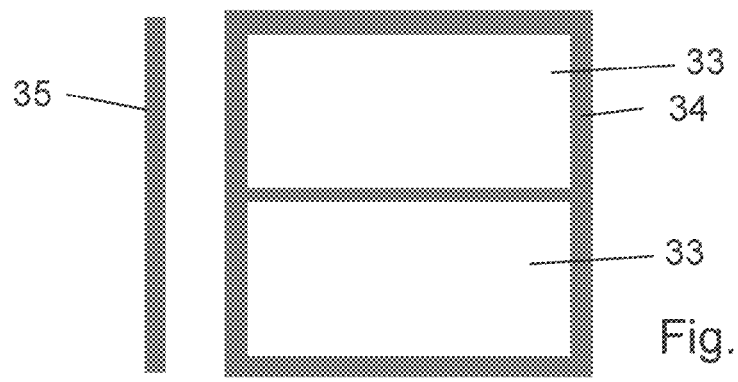

As an alternative thereto, it is also possible to provide, instead of the cover frame 34 having cutouts 33 for each light emitting diode 1, a cover 34' having only two cutouts 33 for in each case two directly adjacent organic light emitting diodes 1, a separate rod-shaped element 35 being used as central axis (FIG. 31).

Figure 32:
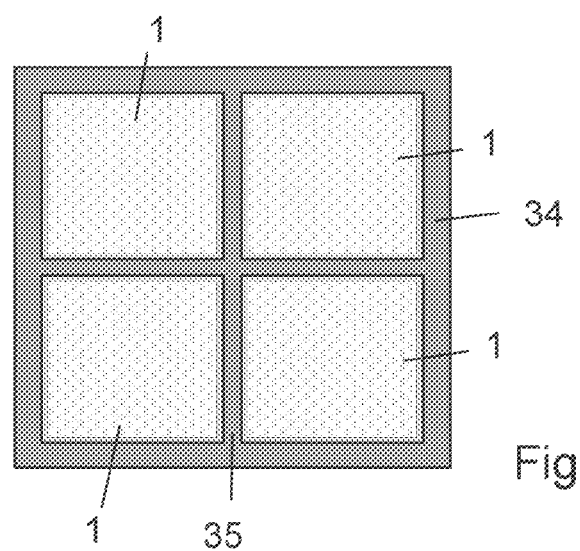

The finished module, illustrated in FIG. 32, is substantially identical to the module in accordance with FIG. 29.

Figure 33:
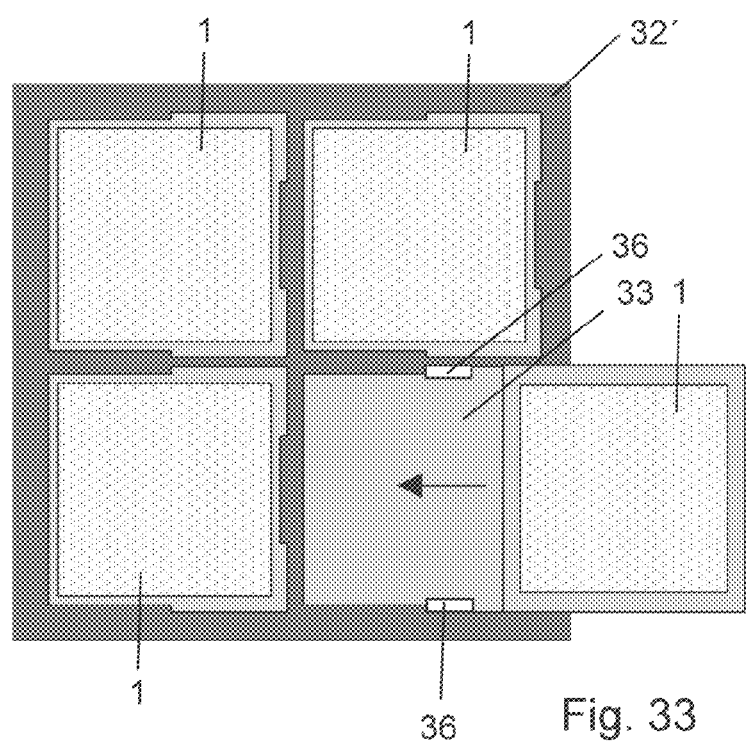
FIG. 33 shows a schematic plan view of a module of organic light emitting diodes in accordance with a further exemplary embodiment.

The module in accordance with the exemplary embodiment in FIG. 33 likewise has a frame 32', which provides a respective cutout 33 for each organic light emitting diode 1. The cutouts 33 are designed as insert compartments into which the organic light emitting diodes 1 can be inserted and latched. At each insert, contact springs 36 are arranged in each case opposite one another, said contact springs being provided for the purpose of becoming located on contact structures 12 arranged in the edge regions 8 of the organic light emitting diodes 1, and thus making electrical contact therewith. In the case of a module having a frame having insert compartments, the organic light emitting diodes can advantageously be exchanged in a particularly simple manner.

Figure 34:
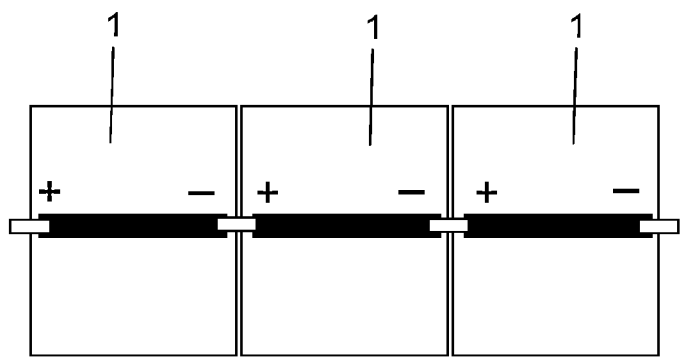
FIGS. 34 to 38 show further schematic plan views of modules of organic light emitting diodes in accordance with further exemplary embodiments.

The module in accordance with the exemplary embodiment in FIG. 34 has three organic light emitting diodes 1, which are arranged alongside one another and are electrically conductively connected in a series circuit via their rear sides. In this case, respectively opposite polarities of adjacent organic light emitting diodes 1 are electrically contact-connected to one another. In this case, the organic light emitting diodes 1 of the module in accordance with the exemplary embodiment in FIG. 34 are provided for emitting light from a radiation exit area 15 arranged at a rear side situated opposite the front side.

Figure 35:
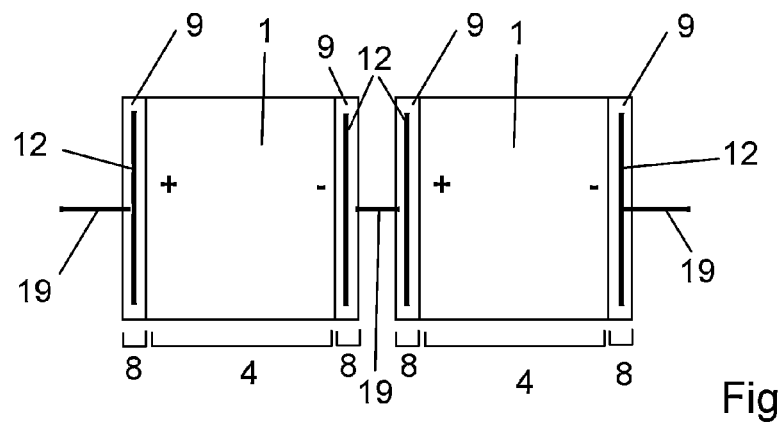

In contrast to the organic light emitting diodes 1 of the module in accordance with FIG. 34, the organic light emitting diode 1 of the module in accordance with the exemplary embodiment in FIG. 35 are transmissive to visible light in the switched-off state. Particularly in the case of such modules, a contact-connection of adjacent light emitting diodes 1 via the rear side, such as is illustrated by way of example in FIG. 34 for example, is undesirable since then the rear-side contact structures are visible in the switched-off state and can thus impair the overall visual impression of the organic light emitting diode module.

Each organic light emitting diode 1 in the case of the module in accordance with the exemplary embodiment in FIG. 35 has a contact structure 12 having a contact region 19 arranged centrally with respect to the metallization 9. In the present case, the contact region 19 is of wire-shaped design and projects laterally over the substrate 2. The wire-shaped contact regions 19 electrically connect respectively opposite polarities of adjacent organic light emitting diodes 1 to one another.

Figure 36:
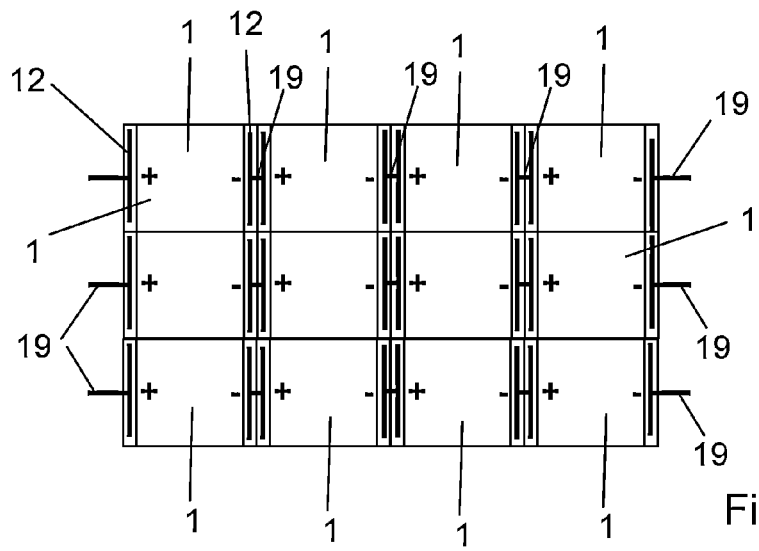

In contrast to the module in accordance with the exemplary embodiment in FIG. 35, the module in accordance with FIG. 36 has a larger number of organic light emitting diodes 1. In this case, the light emitting diodes 1 are arranged in matrix form in a plurality of series. In this case, as already described with reference to FIG. 35, the organic light emitting diodes 1 in a series are electrically connected to one another via wire-shaped contact regions 19.

Figure 37:
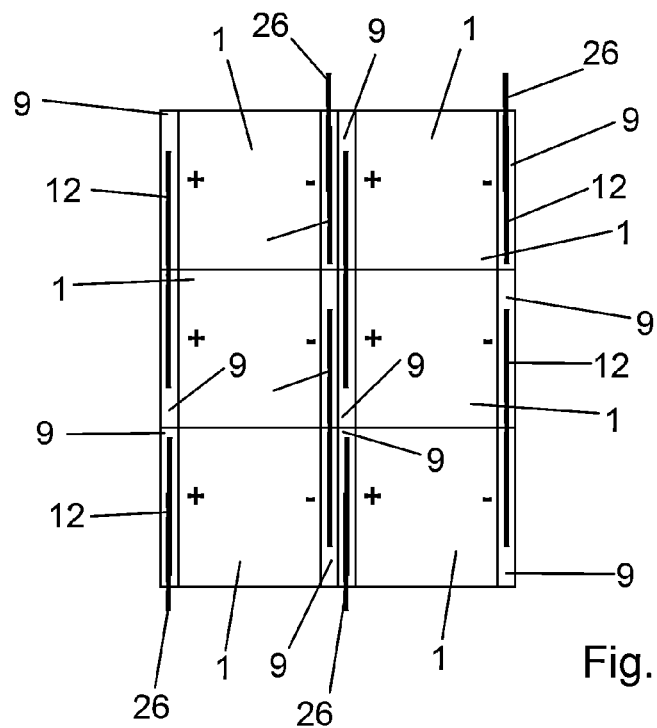

The module in accordance with the exemplary embodiment in FIG. 37 likewise has light emitting diodes 1 whose radiation exit areas 15 are transmissive to visible light in the switched-off state. The metallizations 9 of directly adjacent organic light emitting diodes 1 are in each case electrically conductively connected to a common, separately produced metallic contact structure 12 of rod-shaped design. In this case, the electrical contact-connection is effected in such a way that like polarities of directly adjacent light emitting diodes 1 are electrically conductively connected to one another. The organic light emitting diodes 1 are therefore connected in parallel.

Figure 38:
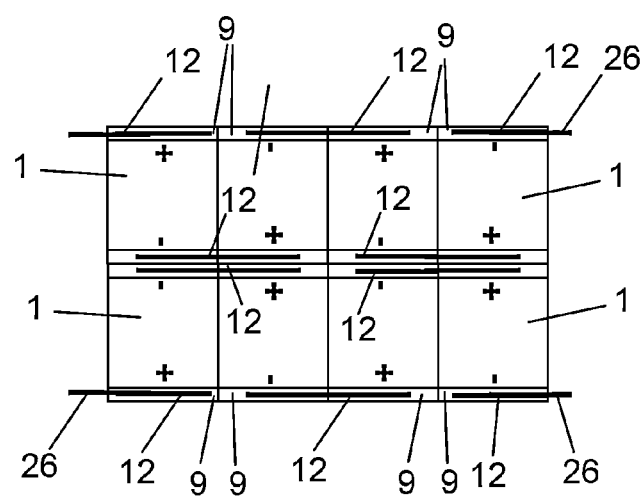

In contrast to the module in accordance with the exemplary embodiment in FIG. 37, the organic light emitting diodes 1 of the module in accordance with FIG. 38 are connected in series. That is to say that directly adjacent organic light emitting diodes 1 are electrically conductively connected to a common rod-shaped, separately produced metallic contact structure 12, opposite polarities being connected to one another.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic light emitting diode comprising:
   a substrate,
   an organic layer sequence configured to generate electromagnetic radiation during operation, wherein the organic layer sequence is arranged in a central region of the substrate;
   a metallization is arranged in an edge region of the substrate and designed to make electrical contact with the organic layer sequence; and
   a separately produced metallic contact structure, which is cohesively and electrically conductively connected to the metallization by a joining process based on ultrasonic technology;
   wherein the contact structure has a main extension plane arranged parallel to main area of the substrate; and
   wherein the contact structure is cohesively and electrically conductively connected to the metallization at at least one connecting point, wherein the contact structure has a main structure in which the at least one connecting point is embedded, and wherein the at least one connecting point comprises a material that is different from a material of the main structure.

2. The organic light emitting diode according to claim 1, wherein the contact structure comprises a material selected from the group consisting of aluminum, copper, brass, zinc, bronze, tin, silver and gold.

3. The organic light emitting diode according to claim 1, wherein the contact structure has a contact region configured to make electrical contact externally.

4. The organic light emitting diode according to claim 3, wherein the contact region is designed as a lug, as an eye or as a wire.

5. A method for producing an organic light emitting diode, the method comprising:
   providing a substrate, wherein an organic layer sequence is arranged in a central region of the substrate, the organic layer sequence generating electromagnetic radiation during operation, and where a metallization is arranged in an edge region of the substrate, the metallization being designed to make electrical contact with the organic layer sequence,
   producing a metallic contact structure, and
   cohesively connecting the contact structure to the metallization, in such a way that an electrically conductive connection arises between the contact structure and the metallization;
   wherein the contact structure has a main extension plane arranged parallel to main area of the substrate; and
   wherein the contact structure is cohesively and electrically conductively connected to the metallization at at least one connecting point, wherein the contact structure has a main structure in which the at least one connecting point is embedded, and wherein the at least one connecting point comprises a material that is different from a material of the main structure.

6. The method according to claim 5, wherein the contact structure is produced from a metal tape.

7. The method according to claim 6, wherein the contact structure is stamped from the metal tape.

8. The method according to claim 5, wherein the contact structure is produced from a metal tape having a main body, into which is embedded a material that differs from the material of the main body.

9. The method according to claim 5, wherein the contact structure is cohesively connected to the metallization by a joining process based on ultrasonic technology.

10. A module comprising at least two organic light emitting diodes, wherein
   each organic light emitting diode has a metallization in an edge region of a substrate, each metallization being designed for making electrical contact with an organic layer sequence;
   the two organic light emitting diodes are electrically conductively connected to one another via a separately produced metallic contact structure that is cohesively connected to at least one of the metallizations;
   wherein each contact structure has a main extension plane arranged parallel to main area of the substrate; and
   wherein each contact structure is cohesively and electrically conductively connected to the metallization at at least one connecting point, wherein each contact structure has a main structure in which the at least one connecting point is embedded, and wherein the at least one connecting point comprises a material that is different from a material of the main structure.

11. The module according to claim 10,
   wherein each organic light emitting diode has a contact structure and a metallization, wherein the contact structure is cohesively and electrically conductively connected to the metallization; and
   wherein each contact structure has a lug via which the organic light emitting diodes are electrically conductively connected.

12. The module according to claim 11, wherein the lugs are electrically conductively connected to one another by clamps or contact springs.

13. The module according to claim 11, wherein the lugs are designed as eyes whose openings are electrically conductively connected for the purpose of making electrical contact.

14. The module according to claim 10, wherein each organic light emitting diode is introduced into an insert of a frame, wherein a contact spring is arranged at each insert, the contact spring becoming located on the contact structure in the course of the organic light emitting diode being latched in, such that an electrically conductive connection arises between the contact structure and the contact spring.

* * * * *